(12) United States Patent
Wang et al.

(10) Patent No.: US 10,347,533 B2
(45) Date of Patent: Jul. 9, 2019

(54) POWER PACKAGE MODULE OF MULTIPLE POWER CHIPS AND METHOD OF MANUFACTURING POWER CHIP UNIT

(71) Applicant: DELTA ELECTRONICS (SHANGHAI) CO., LTD, Shanghai (CN)

(72) Inventors: Tao Wang, Shanghai (CN); Zhenqing Zhao, Shanghai (CN); Kai Lu, Shanghai (CN); Zeng Li, Shanghai (CN); Jianhong Zeng, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 15/230,670

(22) Filed: Aug. 8, 2016

(65) Prior Publication Data

US 2017/0062386 A1  Mar. 2, 2017

(30) Foreign Application Priority Data

Aug. 31, 2015  (CN) .......................... 2015 1 0548984

(51) Int. Cl.
*H01L 21/78* (2006.01)
*H01L 21/54* (2006.01)
(Continued)

(52) U.S. Cl.
CPC .............. *H01L 21/78* (2013.01); *H01L 21/54* (2013.01); *H01L 23/3142* (2013.01);
(Continued)

(58) Field of Classification Search
CPC ....... H01L 23/2142; H01L 2224/03009; H01L 24/96; H01L 24/97; H01L 25/072; H01L 25/115; H01L 21/78
See application file for complete search history.

(56) References Cited

U.S. PATENT DOCUMENTS

| 4,206,436 A | * | 6/1980 | Grunert | .................... H01B 3/02 |
| | | | | 174/521 |
| 2006/0244149 A1 | * | 11/2006 | Nakamura | .............. H01L 24/27 |
| | | | | 257/773 |

(Continued)

FOREIGN PATENT DOCUMENTS

| CN | 104617058 A | 5/2015 | |
| EP | 0365984 A2 * | 5/1990 | ............. C08G 59/58 |
| TW | 201351579 A | 12/2013 | |

OTHER PUBLICATIONS

Office Action dated Dec. 27, 2016 by the TW Office.
The Chinese1OA issued by SIPO dated Jun. 11, 2018.

*Primary Examiner* — Charles D Garber
*Assistant Examiner* — Alia Sabur
(74) *Attorney, Agent, or Firm* — Yunling Ren

(57) ABSTRACT

The embodiments of the present disclosure relate to a power package module of multiple power chips and a method of manufacturing a power chip unit. The power package module of multiple power chips includes: a power chip unit including at least two power chips placed in parallel and a bonding part bonding the two power chips; a substrate supporting the power chip unit and including a metal layer electronically connecting with the power chip unit; and a sealing layer isolating the power chip unit on the substrate from surroundings to seal the power chip unit; the bonding part and the sealing layer are made from different insulated material, the distance of a gap between the two power chips placed in parallel is smaller than or equal to a preset width, and the bonding part is filled in the gap, insulatedly bonding the two power chips placed in parallel.

4 Claims, 34 Drawing Sheets

(51) Int. Cl.
*H01L 23/00* (2006.01)
*H01L 23/31* (2006.01)
*H01L 25/07* (2006.01)

(52) U.S. Cl.
CPC .......... *H01L 23/3178* (2013.01); *H01L 24/03* (2013.01); *H01L 24/08* (2013.01); *H01L 24/49* (2013.01); *H01L 25/072* (2013.01); *H01L 2224/03009* (2013.01); *H01L 2224/085* (2013.01); *H01L 2224/0805* (2013.01); *H01L 2224/73221* (2013.01)

(56) References Cited

U.S. PATENT DOCUMENTS

| | | | |
|---|---|---|---|
| 2009/0243094 A1* | 10/2009 | Itoh | H01L 21/561 257/737 |
| 2012/0292778 A1* | 11/2012 | Liu | H01L 23/3107 257/774 |
| 2013/0200529 A1 | 8/2013 | Lin et al. | |
| 2013/0286618 A1* | 10/2013 | Shibasaki | H01L 23/049 361/772 |
| 2014/0001619 A1* | 1/2014 | Yoo | H01L 24/96 257/676 |
| 2014/0183761 A1* | 7/2014 | Lin | H01L 24/11 257/787 |
| 2015/0145111 A1* | 5/2015 | Mengel | H01L 25/165 257/675 |
| 2015/0171024 A1 | 6/2015 | Choi et al. | |
| 2016/0049348 A1* | 2/2016 | Zhao | H01L 21/568 257/620 |

* cited by examiner

POWER PACKAGE MODULE OF MULTIPLE POWER CHIPS AND METHOD OF MANUFACTURING POWER CHIP UNIT

CROSS REFERENCE

This application claims the priority to and the benefit of the Chinese patent application No. 201510548984.1, filed on Aug. 31, 2015, and entitled "Power package module of multiple power chips and method of manufacturing power chip unit", which is incorporated herein by reference in its entirety.

TECHNICAL FIELD

The present disclosure relates to the technical field of power chip package, and particularly, relates to a power package module of multiple power chips and a method of manufacturing a power chip unit.

BACKGROUND

There are many kinds of package manners for packaging a power semiconductor module. In industry products, the package manners are divided according to sealing materials. The commonly-used two package manners are respectively a gel type and a molding type. For both the gel type and the molding type, an electrical signal connection inside the module is achieved by wire bonding (thick aluminum wires are used generally) between electrodes on a top surface of the chip and a circuit pattern of a Direct Bonded Copper (DBC).

Die bonding process is implemented by picking up a chip from a diced wafer via a die bonder, and bonding the chip to a DBC substrate. During the die bonding, both a force and a position of the chip are controllable from picking up the chip by a vacuum nozzle to bonding the chip to the DBC substrate under a controlled pressure, so as to ensure the chip to avoid damage and set at a designed bonded position. The substrate includes a conductive trace and an insulation layer. During the die bonding process for multiple power chips, each chip needs to be bonded to the substrate independently, thereby a distance P between two chips is determined by a bonded position offset W of a single chip and a distance G between the conductive traces. The bonded position offset W is mainly effected by a coating offset of the die-attach (connecting material), a chip bonding offset, and a precision of pattern on the conductive trace of the substrate, and is limited by a precision of the process and a material of the substrate. The manufacture may relate to a common conductive trace which refers to that a plurality of chips are provided on one conductive trace and non-common conductive traces which refer to that a plurality of chips are provided on different conductive traces. FIG. 1 is a cross section schematic view showing two power chips 11 are in the non-common conductive traces when being bonded to a substrate 13 via a die-attach 12, wherein a reference number 14 refers to the conductive traces. FIG. 2 is a plan view corresponding to FIG. 1, wherein a minimum offset W is 0.1 mm, a minimum distance G between the conductive traces is 0.2 mm, therefore, a distance P between two chips whose bottoms are in the non-common conductive traces is at least 0.4 mm (wherein P=2*W+G). FIG. 3 is a cross section schematic view showing two power chips 11 are in the common conductive trace when being bonded to a substrate 13 via a die-attach, wherein bottoms of the two power chips are in the common conductive trace. FIG. 4 is a plan view corresponding to FIG. 3. In order to prevent the chips from contacting with each other, W is at least 0.1 mm, such that the distance P between the chips is at least 0.2 mm (wherein P=2*W).

Therefore, for the power package module of multiple power chips, it is difficult to obtain a relatively small distance between the chips with common conductive trace or non-common conductive traces by the package process at present.

SUMMARY

With respect to the deficiency in the related art, the present disclosure provides a power package module of multiple power chips and a method of manufacturing a power chip unit to solve the technical problem in the related art that it is difficult to obtain a relatively small distance between the chips and thus an efficiency of the power module is reduced.

In one aspect, the present disclosure provides a power package module of multiple power chips, including:

a power chip unit including at least two power chips placed in parallel and a bonding part bonding the two power chips;

a substrate supporting the power chip unit and including a metal layer which is electronically connected with the power chip unit; and a sealing layer isolating the power chip unit on the substrate from surroundings to seal the power chip unit;

wherein the bonding part and the sealing layer are made from different insulated materials, a gap between the two power chips placed in parallel is smaller than or equal to a preset width, and the bonding part is filled into the gap for bonding and insulating the two power chips placed in parallel.

In an embodiment of the present disclosure, the preset width is 200 μm.

In another embodiment of the present disclosure, a thickness of the bonding part is in a range of ⅓T~T, wherein T refers to a thickness of the power chip.

In another embodiment of the present disclosure, a material of the bonding part has a rigidity more than Shore A10, an insulating strength more than 10 kV/mm, and an electrical resistivity more than 1.0E11 Ω·cm.

In another embodiment of the present disclosure, the bonding part contains filler, and a maximum particle diameter of the filler is smaller than the preset width.

In another embodiment of the present disclosure, a material of the filler is one of, or a combination of more than one of a quartz, an alumina, an aluminum hydroxide, a zinc oxide and a boron nitride.

In another embodiment of the present disclosure, the power package module of the multiple power chips further includes a metal bonding wire for connecting the power chip and the metal layer.

In another embodiment of the present disclosure, the two power chips in the power chip unit are connected in parallel, and a width of the bonding part is smaller than or equal to the preset width to improve a uniformity of a parasitic inductance between the two parallel-connected power chips bonded by the bonding part.

In another embodiment of the present disclosure, the two power chips in the power chip unit are connected in series, and a width of the bonding part is smaller than or equal to the preset width to reduce a parasitic inductance between the two series-connected power chips bonded by the bonding part.

In another embodiment of the present disclosure, the power chip is a vertical power chip.

In another aspect, the present disclosure also provides a method of manufacturing a power chip unit, the power chip unit including at least two power chips placed in parallel, and the method including steps of:

providing a wafer including a plurality of power chips arranged in an array;

after coating a lining at one side of the wafer, dicing the other side of the wafer to form a gap between the power chips;

coating a bonding part on the other side of the wafer and fill the bonding part into the gap between the power chips; and dicing a part of the bonding part in the wafer to separate out a plurality of independent power chip units, wherein the power chips in the power chip unit are bonded by the bonding part.

In an embodiment of the present disclosure, a gap between the power chips is smaller than a preset width.

In another embodiment of the present disclosure, the preset width is smaller than or equal to 200 μm.

In another embodiment of the present disclosure, a material of the bonding part has a rigidity more than Shore A10, an insulating strength more than 10 kV/mm, and an electrical resistivity more than 1.0E11 Ω·cm.

The present disclosure has the following advantageous effects: during the process of wafer handling, the bonding part is filled into the gap between two parallel-placed power chips, such that the chips could be insulated from each other, and could be bonded with a close distance. During packaging of the power semiconductor module, a plurality of power chips could be packaged by one mounting process, such that the mounting efficiency could be improved. Moreover, the distance between the chips is reduced, therefore, the parasitic inductance between the power chips is reduced, the maximum junction temperature of the chips is decreased, the loss and the voltage stress of the power chip is decreased, thusly improving reliability and efficiency of the power package module.

DETAILED DESCRIPTION

The typical embodiments embodying features and advantages of the present disclosure will be described in detail in the following description. It should be understood, various modifications may be made on the basis of different embodiments in the present disclosure, and all of which do not depart from the scope of the present disclosure. The explanations and drawings are used for illustration in essential, rather than restricting the present disclosure.

Figure 5:
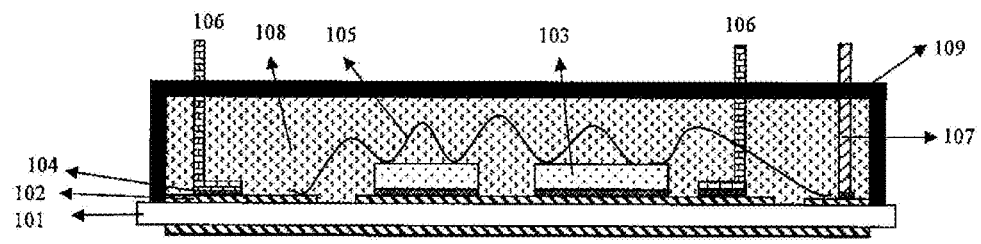
FIG. 5 is a schematic view of a structure of a typical semiconductor power module in gel type.

The structure of a semiconductor power module in gel type is shown in FIG. 5. Both a first surface and a second surface of a DBC substrate 101 are provided with a metal layer. The metal layer at the first surface of the DBC substrate 101 is etched to form a circuit pattern (i.e., a conductive trace) 102. Meanwhile, the DBC substrate 101 is used as an attaching substrate for a chip 103, and the whole bottom surface of the chip 103 is completely welded to the conductive trace 102 of the DBC substrate 101 through a solder (i.e., a die-attach). An electrical signal connection inside the module is achieved by a wire bonding using the wire 105 (thick aluminum wires are usually used) between an electrode on the top of the chip 103 and the conductive trace 102. Then a power terminal 106 and a gate terminal 107 are welded to the DBC substrate 101 through a solder 104 so as to enable the power module to be electrically connected to external circuit(s). Since the semiconductor power chip is easy to be affected by moisture, ions and dust, a silicone gel 108 is used to package and protect the semiconductor power chip. Moreover, in order to stabilize the structure of the power terminal, a plastic housing 109 is generally installed to provide a mechanical support for the power terminal. The plastic housing is formed on the first surface of the DBC substrate, i.e., the DBC substrate and the metal layer on the second surface thereof are exposed to the external.

Figure 6:
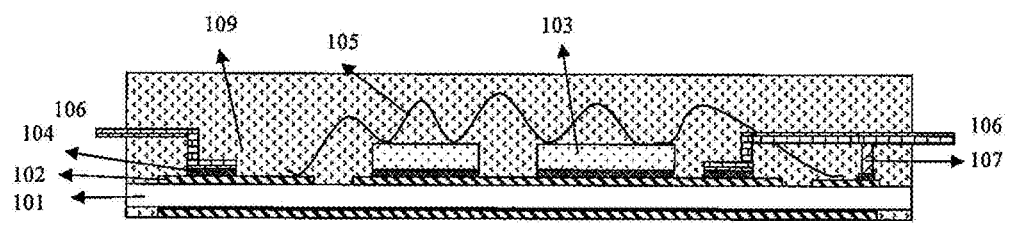
FIG. 6 is a schematic view of a structure of a typical semiconductor power module in molding type.

The structure of a typical semiconductor power module in molding type is shown in FIG. 6. The DBC substrate 101, the conductive trace 102, the chip 103, the solder 104, the wire 105, the power terminal 106 and the gate terminal 107 are the same as those shown in FIG. 5. The differences between the structure shown in FIG. 5 and that shown in FIG. 6 lie in: the sealing materials are different (a plastic package material 109 is filled as shown in FIG. 6); and additionally, the power terminal shown in FIG. 6 is not an independent terminal, but generally adopts an integral lead-frame which is welded to the DBC substrate 101 to achieve an electrical signal connection, and a tie bar between the lead-frames is trimmed and bended after the power module is packaged. The plastic package material is an epoxy material, and thus the plastic package material could be well connected to other package material(s); and the plastic package material has a relatively high mechanical strength, thereby it can fix the terminal stably.

Figure 7:
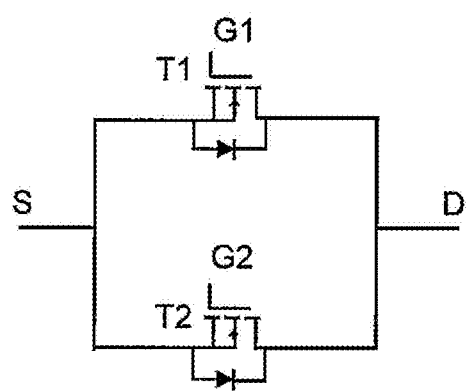
FIG. 7 is a schematic view of a topology of two power chips in parallel configuration.
Figure 8:
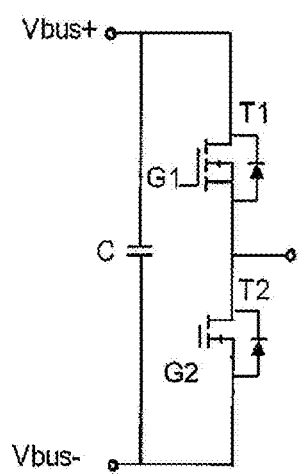
FIG. 8 is a schematic view of a topology of two power chips in half bridge configuration.

The above is an introduction to the structures of two types of power module with different packages. The package module also can be generally divided into a parallel configuration and a half bridge configuration according to topological structures achieving different functions. The through-flow capability of the power chip may be restricted by a manufacturing process, a heat dissipation and so on of the chip. If applying in a much higher level of power or current, it is possible to use a plurality of power chips connected in parallel. FIG. 7 illustrates a schematic diagram of a topology of two power chips in parallel configuration, wherein source electrodes S of the two power chips T1 and T2, and drain electrodes D of the two power chips T1 and T2 are connected in parallel. FIG. 8 illustrates a schematic diagram of a topology of a half bridge configuration. The so-called "half bridge configuration" substantially means that two power chips are connected in series. As shown in FIG. 8, the source electrode S of the chip T1 is connected to the drain electrode D of the chip T2, the drain electrode D of the chip T1 is connected to a conductive trace Vbus+, and the source electrode S of the chip T2 is connected to another conductive trace Vbus−.

Figure 1:
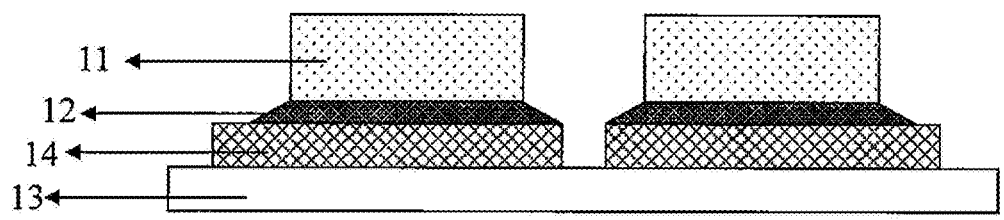
FIG. 1 is a cross section schematic view showing that two power chips are in non-common conductive traces when being bonded to a substrate via a die-attach in the prior art.
Figure 2:
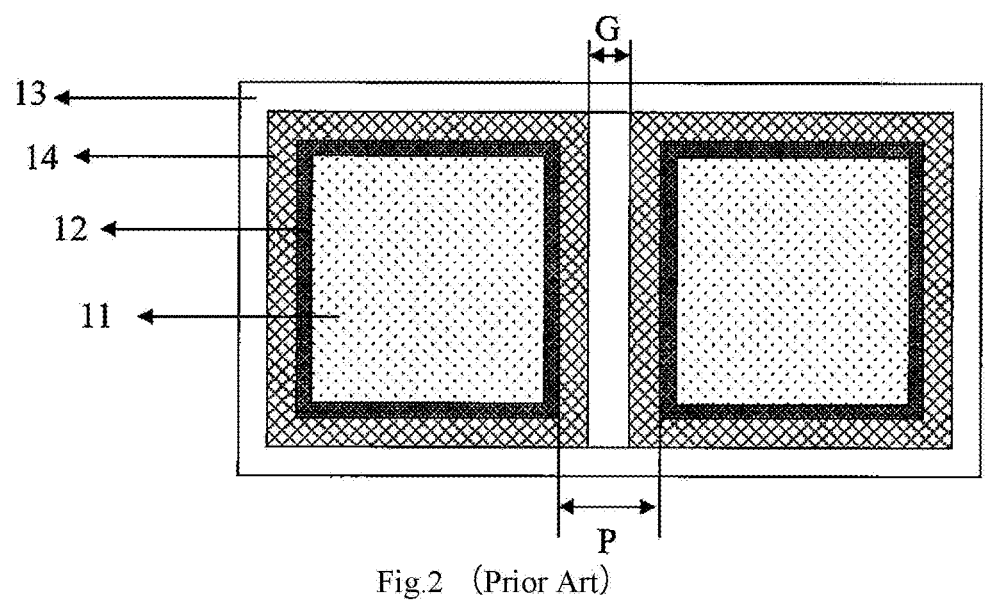
FIG. 2 is a plan view of the structure in FIG. 1 in the prior art.
Figure 3:
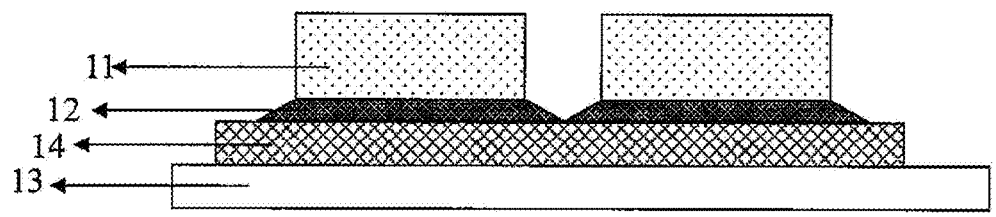
FIG. 3 is a cross section schematic view showing that two power chips are in common conductive trace when being bonded to a substrate via a die-attach in the prior art.
Figure 4:
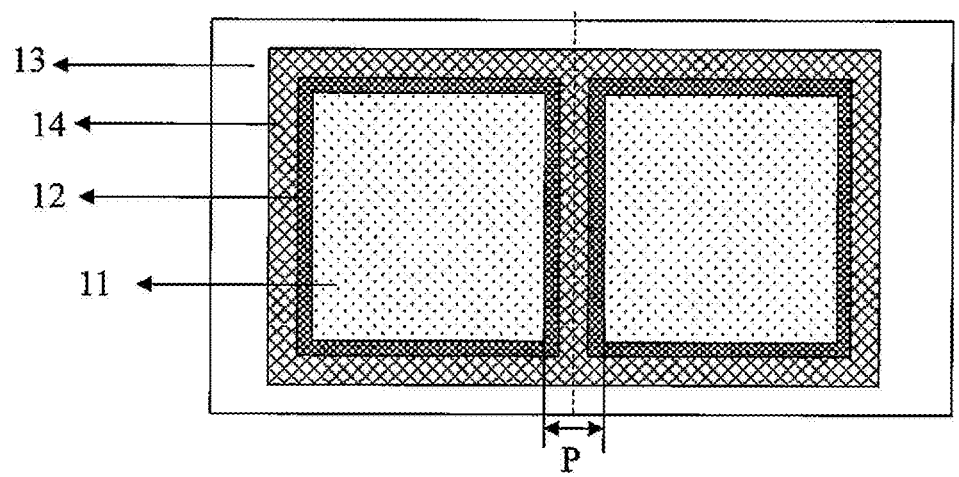
FIG. 4 is a plan view of the structure in FIG. 3 in the prior art.
Figure 9:
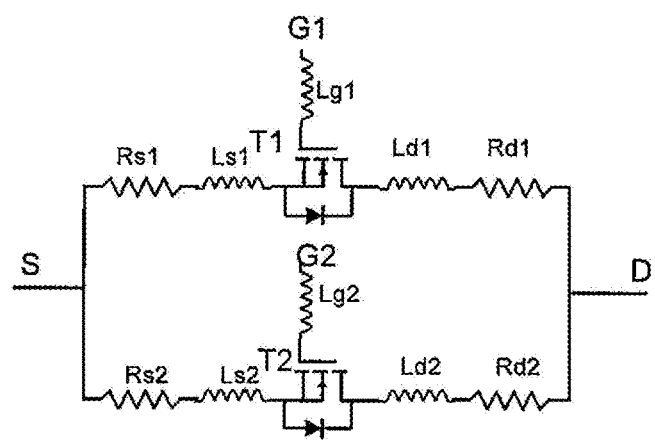
FIG. 9 is a schematic view of a topology of the parallel configuration with parasitic parameters.
Figure 10:
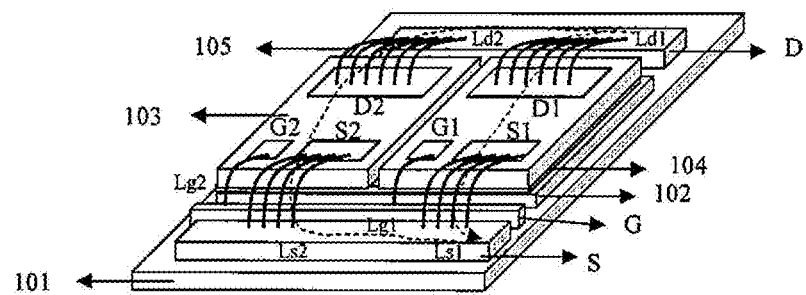
FIG. 10 is a schematic view showing a package structure of the parallel configuration with wire bonding.

In the power package module, considering the path of the electrical connection, as for both the package module in gel type in FIG. 1 and the package module in molding type in FIG. 3, thick aluminum wires are used to connect the conductive trace on the first surface of the DBC substrate, which will result in parasitic parameters. FIG. 9 illustrates a topology graph of a power module in the parallel configuration with the parasitic parameters. Described with an example in which two chips are connected in parallel, the main parasitic parameters of the chip T1 includes $Lg1$, $Ld1$, $Ls1$, etc., the main parasitic parameters of the chip T2 includes $Lg2$, $Ld2$, $Ls2$, etc., wherein, $Lg1$ and $Lg2$ are parasitic inductances from a gate (G1/G2) to a gate drive of the chip, which affect switching speeds of the chips T1 and T2. If $Lg1$ is different from $Lg2$, then the switching speeds of the chips T1 and T2 are different, and their switching losses are different. $Ld1+Ls1$, and $Ld2+Ls2$ are parasitic inductances between the drain electrode (D1/D2) and the source electrode (S1/S2) of the chips T1 and T2 in electrical connection, including the thick aluminum wires and the conductive traces on a part of the substrate, which will affect current distributions of the chips T1 and T2 at the moment of being turned-on. If $Ld1+Ls1$ and $Ld2+Ls2$ are unequal, the current unevenly flows through the chips. The larger the difference of $Ld1+Ls1$ and $Ld2+Ls2$ is, the larger the current difference in the chips at the moment of being turned-on is, the larger the loss is, and the larger the temperature difference is, which results in an increase of a maximum junction temperature of the chip. The parasitic parameters in the chips T1 and T2 will be different due to the layout of the chips. FIG. 10 is a schematic view showing a package structure in the parallel configuration with wire bonding, the package structure includes a substrate 101, a conductive trace 102, a chip 103, a solder 104 and a wire 105, both D1 and D2 are connected to an independent conductive trace D, both G1 and G2 are connected to an independent conductive trace G, and both S1 and S2 are connected to an independent conductive trace S. It can be seen from analysis for the parasitic parameters of the chips T1 and T2, one factor that can impact the parasitic parameter is a distance between the parallel chips. If the distance is reduced, the differences between the parasitic parameters Lg1 and Lg2, Ld1+Ls1 and Ld2+Ls2 of the parallel chips are reduced, such that the current distribution in the parallel chips will be balanced, loss will be reduced, thus improving efficiency, and reducing the maximum junction temperature of the chips. The maximum junction temperature of the chip refers to a maximum value of junction temperatures of the chip during operation.

Figure 11:
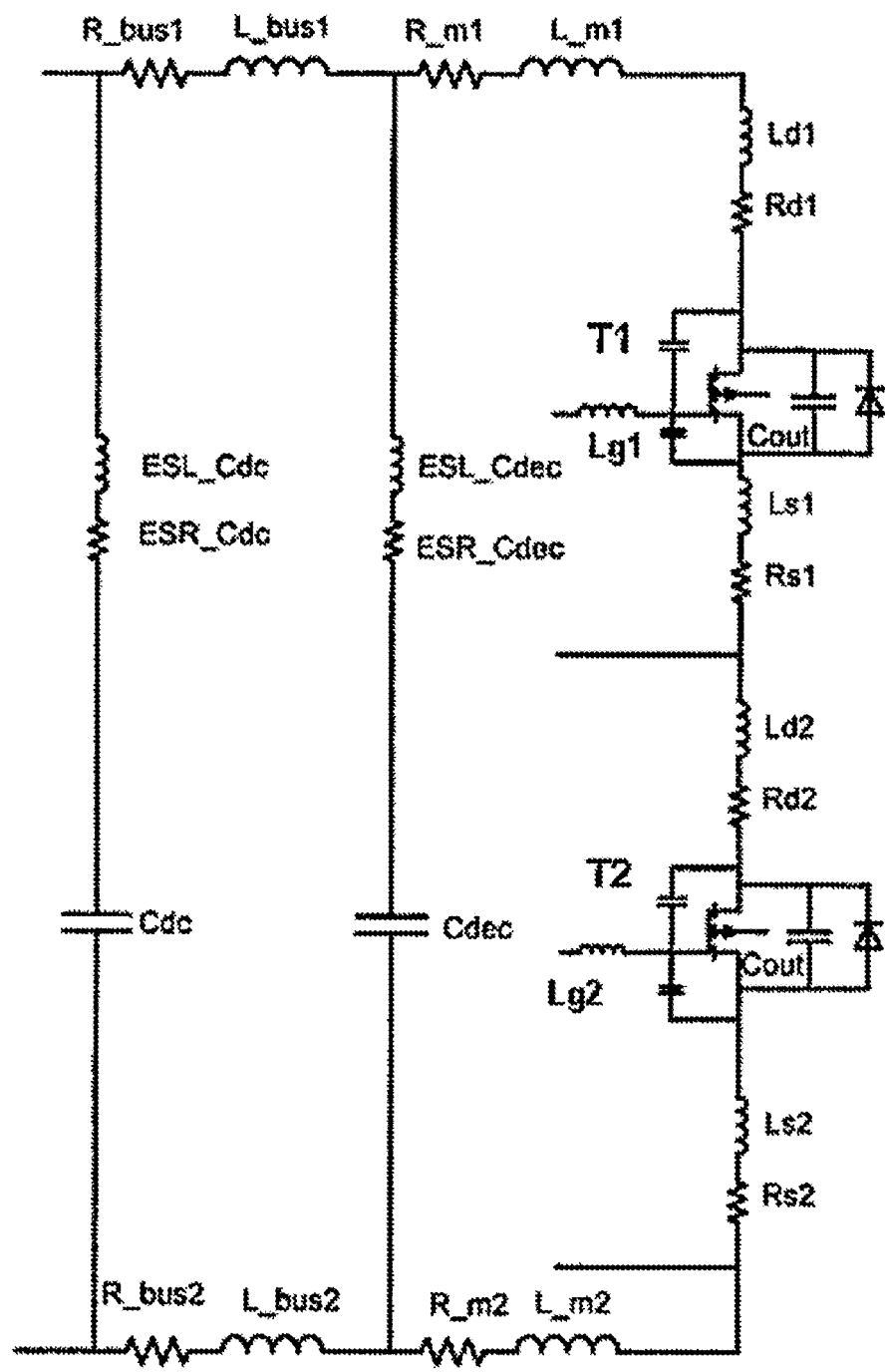
FIG. 11 is a schematic view of a topology of a half bridge configuration with parasitic parameters.

FIG. 11 illustrates a topology graph of a power module in a half bridge configuration with parasitic parameters. Taking a planar power chip as an example, the main parasitic parameters of the chip T1 includes Lg1, Ld1, Ls1, and etc., and the main parasitic parameters of the chip T2 includes Lg2, Ld2, Ls2, and etc. Ld1+Ls1 and Ld2+Ls2 corresponding to the main circuit are parasitic parameters between the drain electrode D1 and D2 and the source electrode S1 and S2 of the chips T1 and T2 in electrical connection respectively, including the thick aluminum wires and the conductive traces on a part of the substrate. Reduction of Ls1+Ld2 will decrease a voltage stress of the chip T2, and reduction of Ls1 will increase a switching speed of the chip T1, and reduce its loss.

Figure 12:
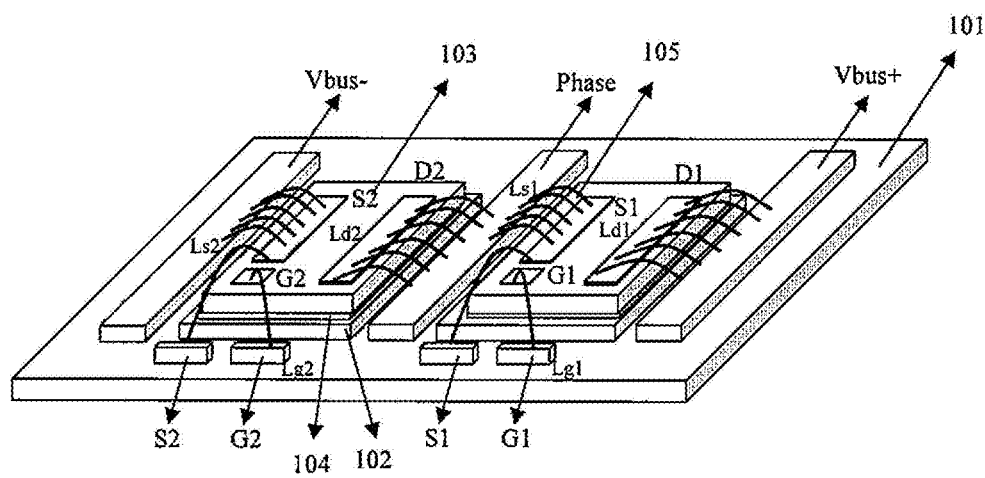
FIG. 12 is a schematic view showing a package structure of the half bridge configuration with wire bonding.

FIG. 12 is a schematic view showing a package structure in a half bridge configuration with wire bonding. The package structure includes a substrate 101, a conductive trace 102, a chip 103, a solder 104 and a wire 105, wherein the conductive trace 102 includes a plurality of independent conductive terminals, such as Vbus+, Vbus−, G1, S1, G2, and S2. As shown in FIG. 12, S2 of T2 is connected to an independent conductive terminal Vbus− and the conductive terminal S2, G2 of T2 is connected to an independent conductive terminal G2, D2 of T2 and S1 of T1 are connected to an independent conductive terminal Phase, S1 of T1 is further connected to an independent conductive terminal S1, G1 of T1 is connected to an independent conductive terminal G1, and D1 of T1 is connected to an independent conductive terminal Vbus+. It can be seen from FIG. 12 which is a schematic view showing a package structure in the half bridge configuration with wire bonding, Ls1+Ld2 is mainly affected by an electrical connection path between the source electrode S1 of the T1 and the drain electrode D2 of T2, if the distance between T1 and T2 is shortened, Ls1 and Ld2 may be reduced, thus decreasing the voltage stress of T2 and increasing the switching speed of T1, and improving reliability and efficiency of the chip.

In conclusion, based on analysis about electrical characteristics of the power module, the conventional power semiconductors are usually affected by the parasitic parameters, thus inducing a relatively large voltage spike in the power semiconductor, which has a serious impact on the performance of the power semiconductor, even the whole power electronic equipment. Therefore, new chip manufacture technique and package structure are needed so as to reduce the distance between the chips. As for the package module of a plurality of chips with parallel configuration, the current distribution in the parallel chips will be even and the loss is reduced, thus improving efficiency, and reducing the maximum junction temperature of the chips. As for the package module with half bridge configuration, the parasitic inductance in the loop may be reduced, thus improving reliability and efficiency of the chips.

First Embodiment

Figure 13:
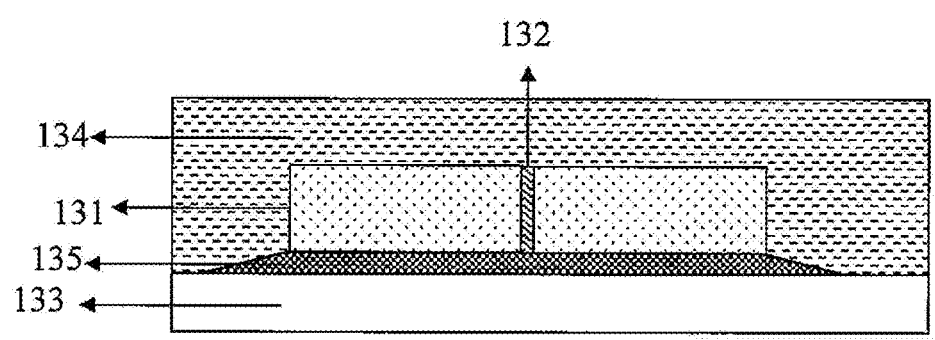
FIG. 13 is a schematic view of a structure of a power package module of multiple power chips according to the first embodiment of the present disclosure.

The present embodiment provides a power package module of multiple power chips as shown in FIG. 13, which includes: a power chip unit, a substrate 133, and a sealing layer 134.

The power chip unit includes at least two power chips 131 placed in parallel and a bonding part 132 bonding the two power chips 131.

The substrate 133 supports the power chip unit and includes a metal layer (not shown in the drawings) electronically connecting with the power chip unit.

The sealing layer 134 seals a surface of the substrate 133 for isolating the power chip unit from surroundings.

The bonding part 132 and the sealing layer 134 are made of different insulating materials. A gap between the two power chips T1 and T2 placed in parallel is smaller than or equal to a preset width. The bonding part 132 is filled in the gap, insulatedly bonding the two power chips T1 and T2 placed in parallel.

Figure 14:
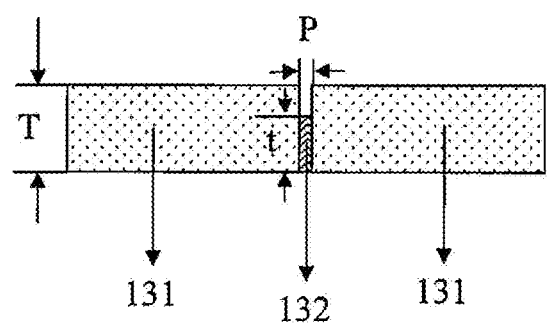
FIG. 14 is a schematic view of a structure of a power chip unit according to the first embodiment of the present disclosure.

FIG. 14 is a schematic view of a power chip unit 200. This embodiment is described with an example that the power chip unit 200 includes two power chips T1 and T2. In actual applications, a plurality of power chips may be selected according to needs, and the plurality of power chips are bonded by the bonding parts to form the power chip unit. During bonding, a plurality of chips could be bonded by one mounting process, such that the mounting efficiency could be improved. Meanwhile, the distance between the chips will not be affected by the mounting process, and a relatively small distance between the chips can be made. The distance P between two chips is mainly restricted by a dicing process of a wafer. Generally, the dicing process includes mechanical dicing, laser dicing and the like using a blade. Therefore, a realizable distance between chips is a width of the dicing blade for dicing a wafer into multiple separated chips. Currently, the dicing width of the above technique is 200 μm at most, thereby the preset width is 200 μm in the present embodiment.

Generally, a coefficient of thermal expansion of the bonding part 132 in the gap of the chips is larger than that of the material of the chips. The bonding part generates a thermal stress because the chips generate heat during working and the coefficient of thermal expansion of the insulated bonding part is not matched with that of the chips, and what's more, the thermal stress of the bonding layer of the chips is occurred due to that the coefficient of thermal expansion of the chips and that of the substrate are not matched, therefore, the bonding part in the gap between chips is prone to be invalid, especially for the module sealed with silicone gel. The thermal stress could be reduced by decreasing the thickness of the bonding part, while the bonding part should have a certain thickness so as to play a good function of bonding the chips. Therefore, the thickness t of the bonding part 132 may be in a range of ⅓T~T, wherein T refers to the thickness of the power chip, with reference to FIG. 14. Generally, the insulated bonding material could be partially diced at the position of bonding part between the chips by adjusting the height of the blade for mechanical dicing via the wafer dicing process during the back-end process for wafer, so as to control the thickness of the bonding part.

The bonding part is able to bond the chips, has a certain mechanical strength, is able to be filled into a dicing slot between the chips, needs a good mobility and slot-filling ability, and is able to achieve insulation between planar chip bases. Considering the above characteristics of the bonding part, the bonding part may be made of bonding material of organic silicone resin including: pure resin-based organic silicone adhesive, epoxy modified organic silicone adhesive, phenolic modified organic silicone adhesive and the like; one-component or two-component vulcanized silicone elastomer; or epoxy resin which may be added with filler to adjust physical characteristics thereof. Particularly, the material of the bonding part is required to have a rigidity more than Shore A 10, an insulating strength more than 10 kV/mm, and a volume resistance more than 1.0E11 Ω·cm. Moreover, the bonding strength between the bonding part and the power chip shall be larger than 100 Pa. Filler may be filled inside the bonding part. If the filler is filled in the bonding part, the maximum diameter of the filler should be smaller than the preset width. The material of the filler may be one of or a combination of quartz, alumina, aluminum hydroxide, zinc oxide and boron nitride. The filler may be observed under a microscope with a magnification of less than 1000 times.

The power chip 131 may be a planar chip which includes a IGBT (Insulated-Gate Bipolar Transistor), a MOSFET (Metal-Oxide Semiconductor Field Effect Transistor), a diode or the like, and also includes a Driver IC chip for driving the power chip and a Control IC chip for achieving a switching control strategy of the chip. The material of the power chip may be Si, SiC, GaN or the like. In addition, the power chip may be an integration of the foregoing single power chip with the Driver IC chip or the Control IC chip, or may be an integration of the Driver IC chip, the Control IC chip and the foregoing single power chip. Similarly, the structure of the present embodiment can also be properly adapted to the vertical switching chip in parallel configuration.

The substrate 133 includes a PCB (Printed Circuit Board), a LF (Lead-frame), a DBC (Direct Bonding Copper) substrate, a DBA (Direct Bonding Aluminum) substrate, a metal co-fired ceramic substrate and a IMS (Insulated Metal Substrate) substrate, a metal or metal composite substrate (e.g. copper, aluminum, AlSiC), a ceramics (e.g. $Al_2O_3$, AlN, BeO, $Si_3N_4$ which are all called ceramics) insulated substrate or the like.

With reference to FIG. 13, a die-attach material 135 is provided between the power chip 131 and the DCB substrate 133, and the die-attach material 135 is used for mounting the power chip on the substrate. The die-attach material 135 may be a solder, an Intermetalic Compound (IMC), may also include a low temperature sintering material (e.g. a material which may be sintered at low temperature so as to attach the power chip and the substrate, such as a silver, and a copper soldering paste), and a conductive bonding material such as a silver conductive adhesive, and may also be an organo-silicone or an epoxy insulated adhesive material. Thereby, the bonding material may be conductive or insulated, which could be selected according to the specific application environment.

The power package module further needs a sealing layer 134 used for cladding the surface of the substrate and the power chip unit composed of the power chip(s) and the bonding part so as to be isolated from surroundings. The sealing layer generally includes a silicone gel, a silicone elastomer, an epoxy molding material, and the like. The ingredient or characteristics of the sealing layer is different from that of the bonding part in the gap between the power chips.

With reference to FIGS. 10 and 12, a metal layer (not shown in FIGS. 13 and 14) is generally provided on the substrate, and the metal layer is used for realizing an electrical connection between the power chip and substrate. Further, the power module of the multiple power chips includes a metal bonding wire for bonding the power chip and the metal layer, wherein the material of the metal bonding wire may be Al, Cu, Au, or the like.

In conclusion, in the power package module of multiple power chips provided by the present embodiment, the bonding part is filled in the gap between the two power chips in parallel arrangement so as to realize insulation between the chips and allow the chips to be bonded with small distance. During package of the semiconductor power module, a plurality of power chips could be bonded by one mounting process, such that the mounting efficiency could be improved. Moreover, the distance between chips is reduced, therefore, the parasitic inductance between chips is reduced, the maximum junction temperature of chips is decreased, loss and voltage stress of the power chips are decreased, thusly improving reliability and efficiency of the power package module.

Second Embodiment

Based on the first embodiment in which the power chip and the metal layer are connected via the metal bonding wire, the present embodiment also provides a power package module of multiple power chips, wherein, two power chips in the power chip unit are in series connection, and the width of the bonding part in the gap between the chips placed in parallel is smaller than or equal to a preset width so as to reduce the parasitic inductance between the chips in series connection which are bonded by the bonding part.

Figure 15:
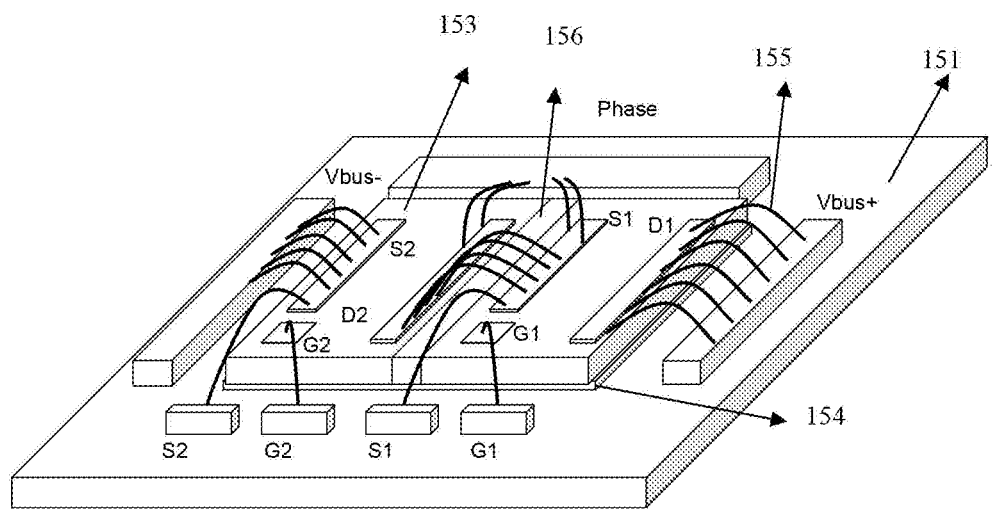
FIG. 15 is a schematic view of a structure of a chip package module in series configuration and non-common bases achieved by using metal bonding wires according to the second embodiment of the present disclosure.

FIG. 15 is a schematic view of a chip package module in series connection achieved by using the metal wire bonding. The two power chips are planar power chips, and may be bonded on the substrate 151 (which has an insulated material) through the bonding material 154 at the bottom of the chip 153 as described in the first embodiment. The chips has non-common bases (referring that the bases of chips are not in an electrical connection), i.e., the bottoms of chips are directly bonded on the substrate through the insulated bonding material 154 without a conductive trace and being floating, and the surface electrical connection of the chips may be achieved via the wire bonding process (using the wire 155). In particular, the wire bonding process could be implemented as follows: a drain electrode D1 of the chip T1 is connected to the conductive trace (terminal Vbus+ in FIG. 15); a source electrode S1 of the chip T1 and a drain electrode D2 of the chip T2 are connected directly via a wire; a source electrode S2 of the chip T2 is connected to the conductive trace (terminal Vbus− in FIG. 15); S1 of T1 and D2 of T2 are connected to the conductive trace (terminal phase in FIG. 15) respectively; signal terminals of gate electrode G1 and G2 and a source electrode S1 and S2 of T1 and T2 are connected to the independent conductive trace respectively; and the bonding part 156 is filled between the chips T1 and T2.

In the present embodiment, since the source electrode S1 of T1 and the drain electrode D2 of T2 are directly electrically connected with each other, and the distance between chips is small, the connecting path is shortened, and the parasitic parameters $L_{s1}$ and $L_{d2}$ in the above half bridge topology configuration are reduced, thus improving efficiency and reliability of the half bridge module.

Third Embodiment

Based on the first embodiment in which the power chip and metal layer are connected via the metal bonding wire, the present embodiment also provides a power package module of multiple power chips, wherein, two power chips in the power chip unit are in parallel connection, and the width of the bonding part in the gap between the chips in parallel connection is smaller than or equal to a preset width so as to improve uniformity of parasitic inductance in two parallel-connected power chips bonded by the bonding part.

Figure 16:
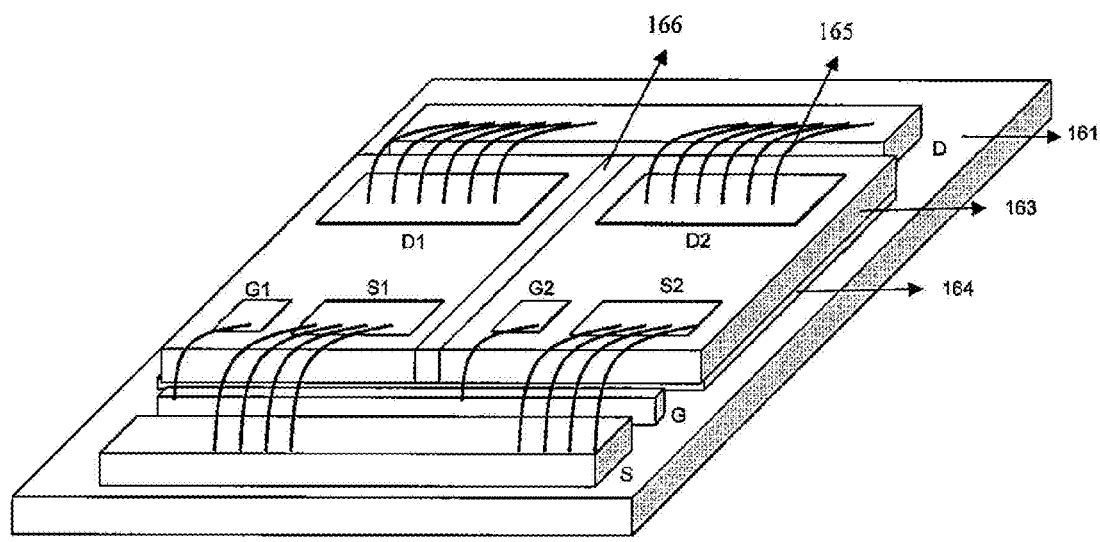
FIG. 16 is a schematic view of a structure of a chip package module in parallel configuration and non-common bases achieved by using metal bonding wires according to the third embodiment of the present disclosure.

FIG. 16 is a schematic view of a chip package module in parallel connection achieved by using the metal wire bonding. The two power chips may be bonded onto the substrate 161 (having insulated material) through the bonding material 164 at the bottom of the chip 173 as described in the first embodiment. The chips are bonded by a bonding part 166. The chips have non-common bases (referring that the bases of the chips are not in an electrical connection), i.e., the bottoms of the chips are directly attached onto the substrate through the bonding material 164 without a conductive trace and being floating, and could be electrically connected at their surface via the wire bonding process. In particular, the wire bonding process could be implemented as follows: drain electrodes D1, D2 of T1 and T2 are connected to the conductive terminal (terminal D in FIG. 16) of the conductive trace; source electrodes S1, S2 of T1 and T2 are connected to the conductive trace (terminal S in FIG. 16); and gate electrodes G1, G2 of T1 and T2 are connected to the conductive terminal (terminal G in FIG. 16) of the conductive trace.

Figure 17:
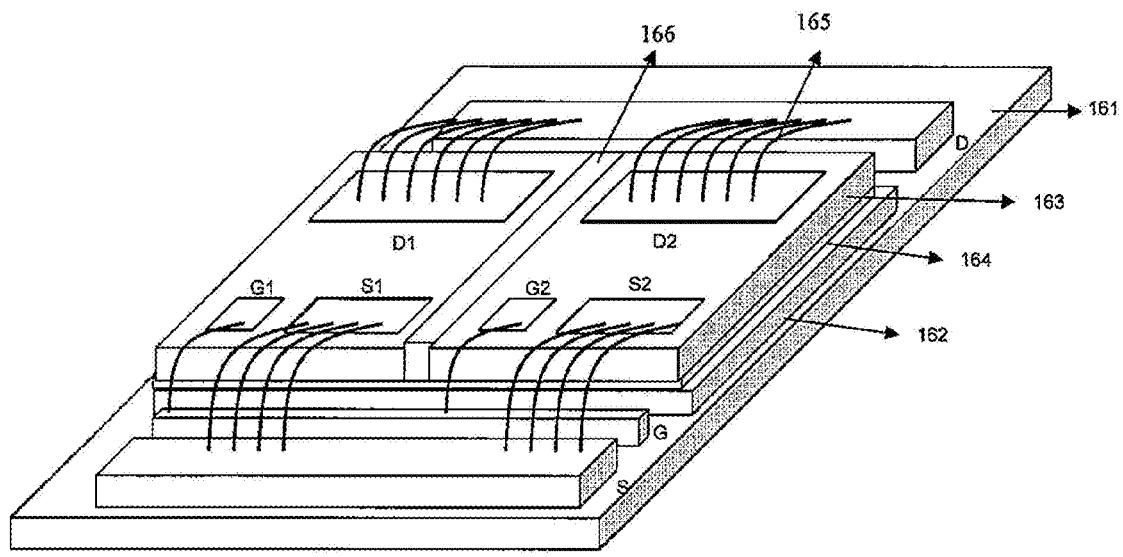
FIG. 17 is a schematic view of a structure of a chip package module in parallel configuration and a common base achieved by using metal bonding wires according to the third embodiment of the present disclosure.
Figure 18:
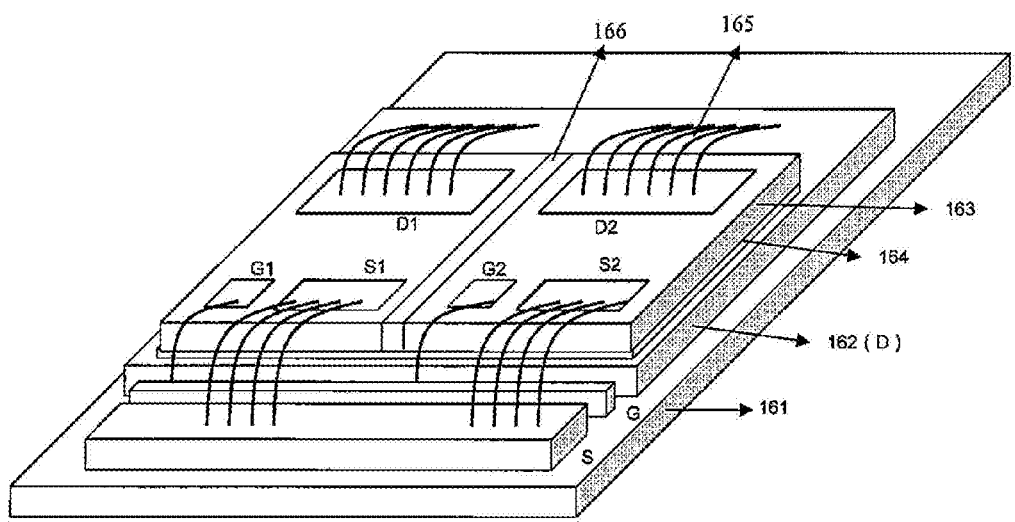
FIG. 18 is a schematic view of a structure of a chip package module in parallel configuration and a common base D achieved by using metal bonding wires according to the third embodiment of the present disclosure.
Figure 19:
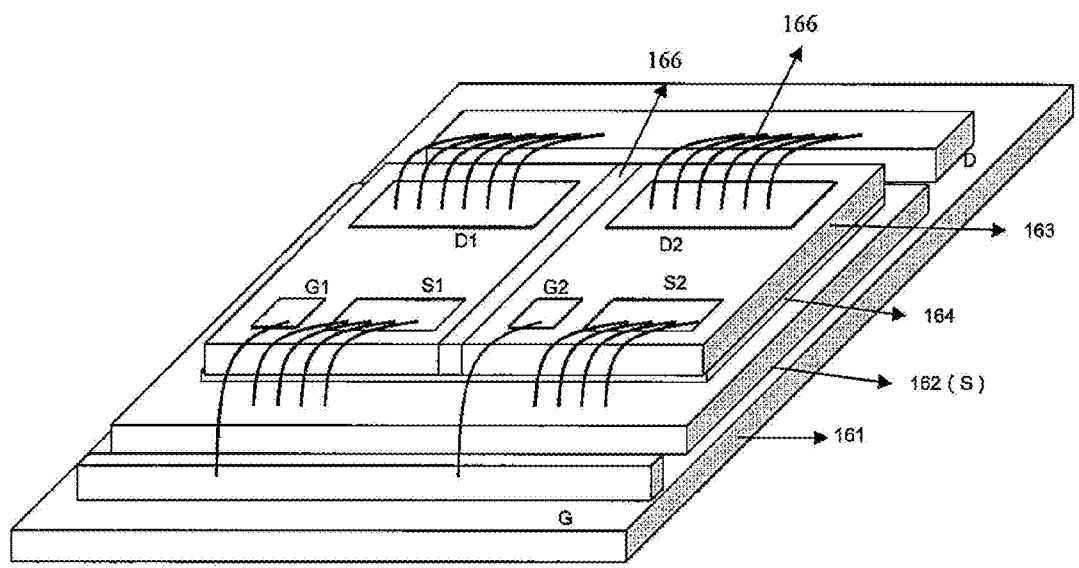
FIG. 19 is a schematic view of a structure of a chip package module in parallel configuration and a common base S achieved by using metal bonding wires according to the third embodiment of the present disclosure.

Different from the embodiment as shown in FIG. 16, the present embodiment further provides three types of parallel-connected chip package module having common bases, which are shown in FIGS. 17, 18 and 19 respectively. In FIG. 17, bottoms of the parallel-connected chips are attached to the independent conductive trace 162 on the substrate via the bonding material, and the conductive trace 162 is floating. In FIG. 18, bottoms of the parallel-connected chips are connected to a terminal D of the conductive trace of the substrate (i.e. terminal D is used as the conductive trace 162) via the bonding material. In FIG. 19, bottoms of the parallel-connected chips are connected to a terminal S of the conductive trace 162 of the substrate (i.e. terminal S is used as the conductive trace 162) via the bonding material.

In the present embodiment, since the distance between chips is reduced, the difference between the package parasitic parameters of parallel-connected chips is reduced, such that the current distribution in the parallel-connected chips will be even, loss will be reduced, thus reducing the maximum junction temperature of chips and improving efficiency.

Fourth Embodiment

Based on the above second and third embodiments, the chips and the metal layer may be electrically connected via the metal bonding wire. However, the parasitic parameter is still large due to the small section area of the metal wire. Therefore, in the present embodiment, the electrical connection between the chips and the metal layer may be achieved by a metal bridge.

Figure 20:
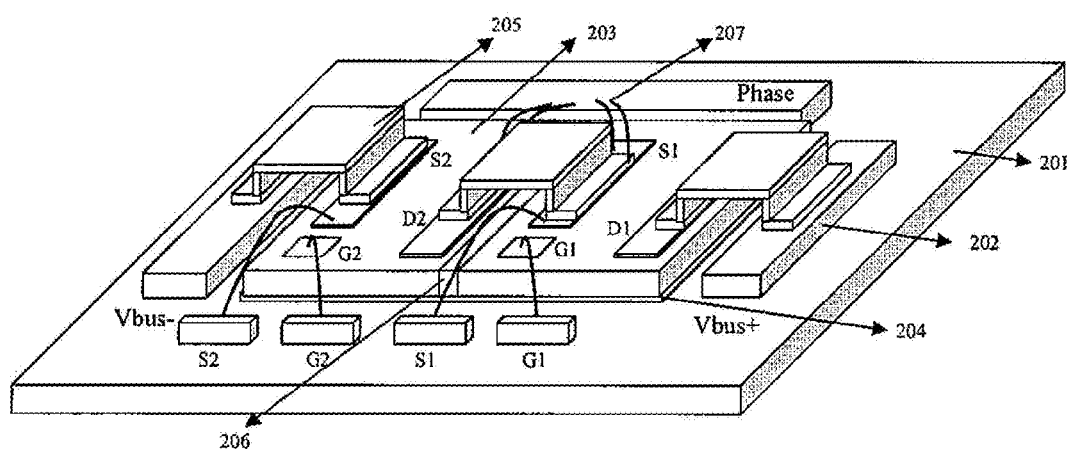
FIG. 20 is a schematic view of a structure of a chip package module in half bridge configuration and non-common bases achieved by using metal bridges according to the fourth embodiment of the present disclosure.

FIG. 20 is a schematic view of a power package module in half bridge configuration. The power package module includes a substrate 201, a conductive trace 202, chips 203, a die-attach material 204 and a bonding part 206 between the chips. In the half bridge module, the metal bridge 205 could be adopted to connect a drain electrode D1 of the chip T1 and the terminal Vbus+ of the first conductive trace, connect a source electrode S1 of the chip T1 and the drain electrode D2 of the chip T2, and connect a source electrode S2 of the chip T2 and a terminal Vbus− of the second conductive trace. The material of the metal bridge may be Al, Cu, Ag, Au or the like, and the adopted bonding process is an ultrasonic bonding, a metal-metal diffusion bonding, a welding process or the like. Other connecting lines may be connected still by the connecting method of the metal bonding wire 207 or the metal bridge 205.

Similar with the second embodiment, the types of the chip package module in half bridge configuration connected by the metal bridge are divided into a structure of non-common base and a structure of common base, and FIG. 20 is a schematic view of a chip package module in half bridge configuration with non-common bases. In addition to the structure of non-common base, the module may also have the structure of common base, or may have common bases being floating, or have common bases connecting to Vbus−, or have common bases connecting to phase.

Figure 21:
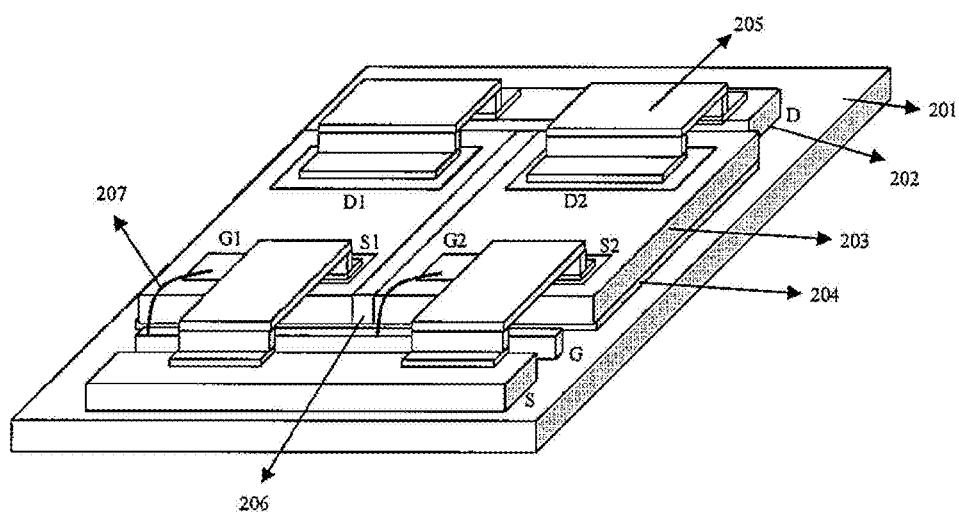
FIG. 21 is a schematic view of a structure of a chip package module in parallel configuration and non-common bases achieved by using metal bridges according to the fourth embodiment of the present disclosure.
Figure 22:
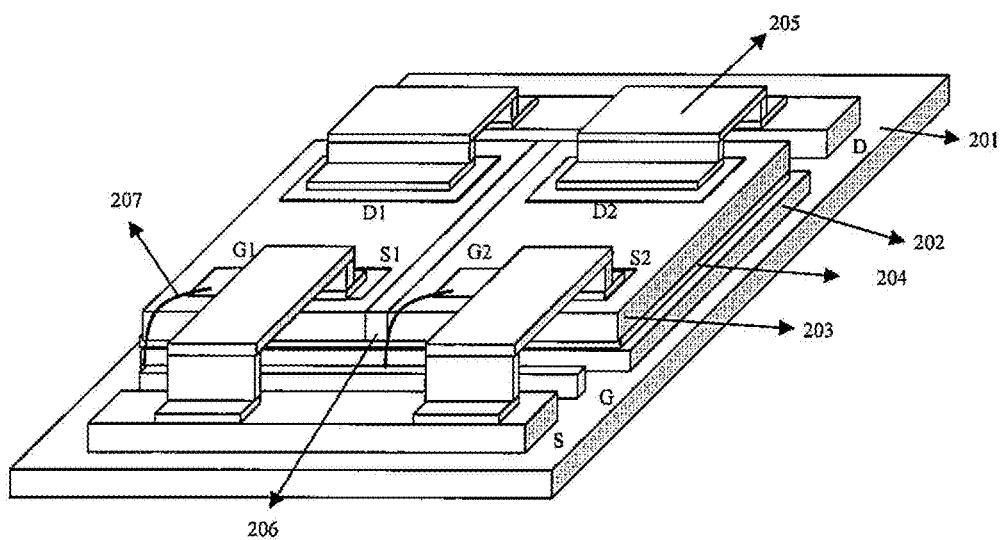
FIG. 22 is a schematic view of a structure of a chip package module in parallel configuration and a common base achieved by using metal bridges according to the fourth embodiment of the present disclosure.
Figure 23:
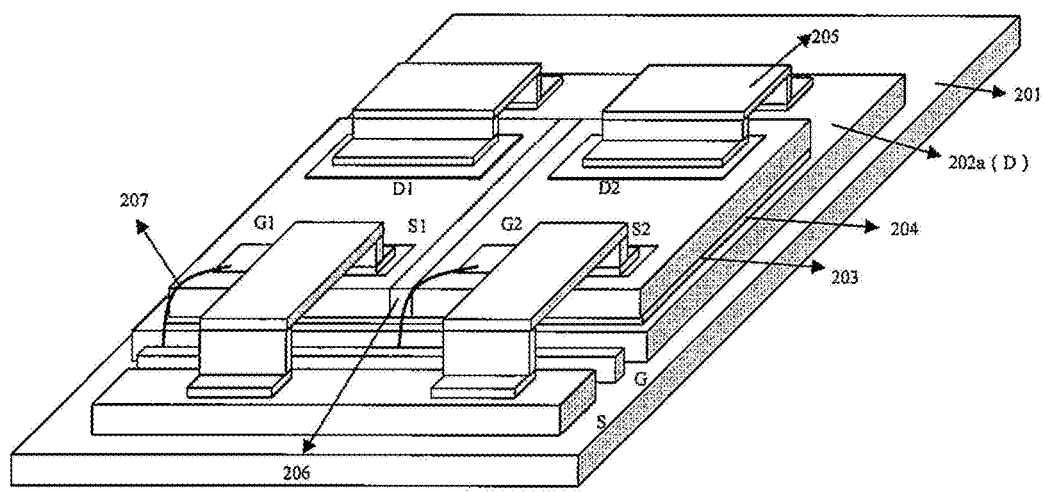
FIG. 23 is a schematic view of a structure of a chip package module in parallel configuration and a common base D achieved by using metal bridges according to the fourth embodiment of the present disclosure.
Figure 24:
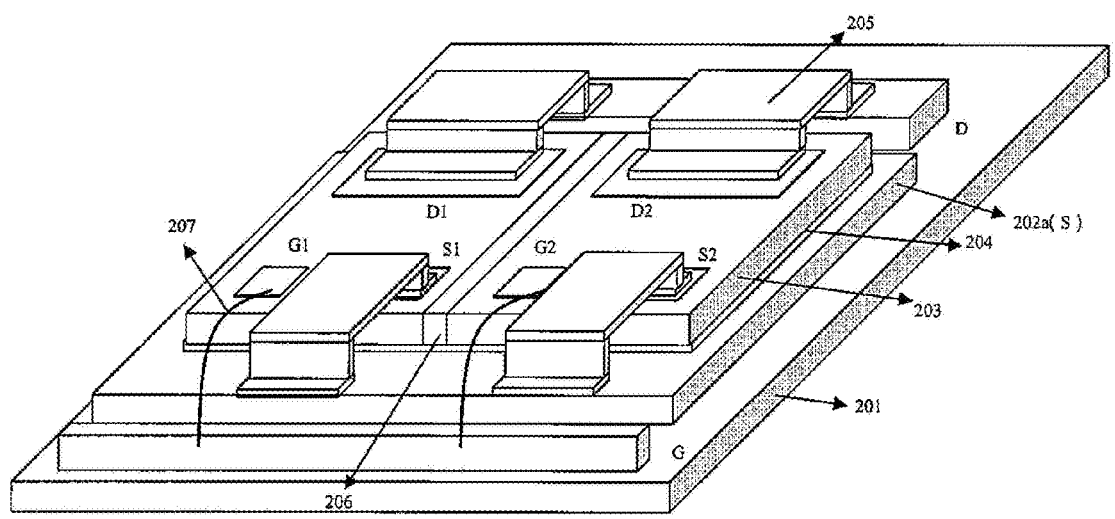
FIG. 24 is a schematic view of a structure of a chip package module in parallel configuration and a common base S achieved by using metal bridges according to the fourth embodiment of the present disclosure.

FIGS. 21 to 24 are schematics view of a chip package module in parallel configuration, in which the metal bridges are adopted to connect the drain electrode D1/D2 of the chip T1/T2 and the terminal D of the conductive line, as well as the source electrode S1/S2 of the chip T1/T2 and the terminal S of the conductive line. FIG. 21 is a schematic view of a chip package module in parallel configuration with non-common bases. FIG. 22 is a schematic view of a chip package module in parallel configuration with common bases (being floating). FIG. 23 is a schematic view of a chip package module in parallel configuration with common bases (having a common base with terminal D), i.e., the terminal D is used as the common base 202a. FIG. 24 is a schematic view of a chip package module in parallel configuration with common bases (having a common base with terminal S), i.e., the terminal S is used as the common base 202a.

In the present embodiment, regardless of the half bridge configuration or the parallel configuration, if the power chip and the metal layer are electrically connected via the metal bridge, the section area of the electrical connection will be increased, thus further reducing the parasitic parameters.

Fifth Embodiment

Figure 25:
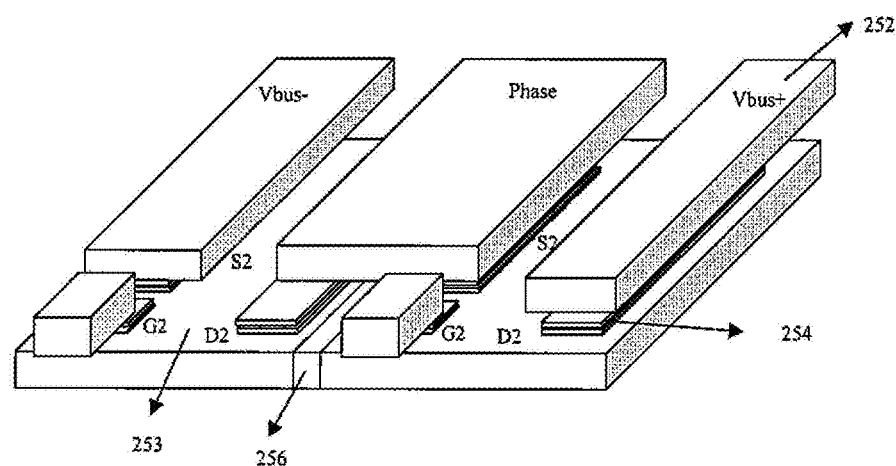
FIG. 25 is a schematic view of a structure of a chip package module in half bridge configuration using a flip-chip process according to the fifth embodiment of the present disclosure.
Figure 26:
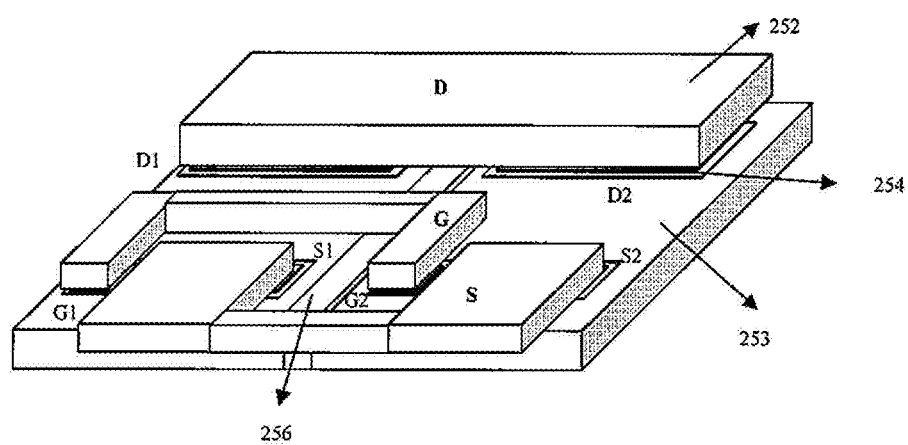
FIG. 26 is a schematic view of a structure of a chip package module in parallel connection configuration using the flip-chip process according to the fifth embodiment of the present disclosure.

Based on the fourth embodiment, the power chip and the metal layer could be electrically connected via the metal bridge. However, the metal bridge needs to be bent when being connected, which results in a long conductive path and a relative large parasitic parameter in corresponding loop. The present embodiment adopts the flip-chip process in order to reduce the electrical path. Without consideration of the connection type of bases in the chips (in the subsequent embodiments, the connection type of bases in the chips also includes the above-mentioned two structures of non-common base and common base), as shown in FIGS. 25 and 26, the surface of the chip is bonded on the conductive trace of the substrate using the die-attach material so as to realize an electrical connection between the half bridge module and the parallel-connected module, wherein, the die-attach material is the conductive die-attach material as mentioned in the first embodiment. If the distance among the electrodes G, S and D of the chip is small, interconnection of the die-attach material will be occurred between different electrodes of the chips, which will result in short circuit. Therefore, in the present embodiment, based on the flip-chip process, a conductive ball or a conductive pillar is employed to separate the conductive trace from the electrodes of the chips, so as to reduce the risk of short circuit of the electrodes. In the drawings, a conductive trace 252, chips 253, a die-attach material 254 and a bonding part 256 between chips are included.

Figure 27:
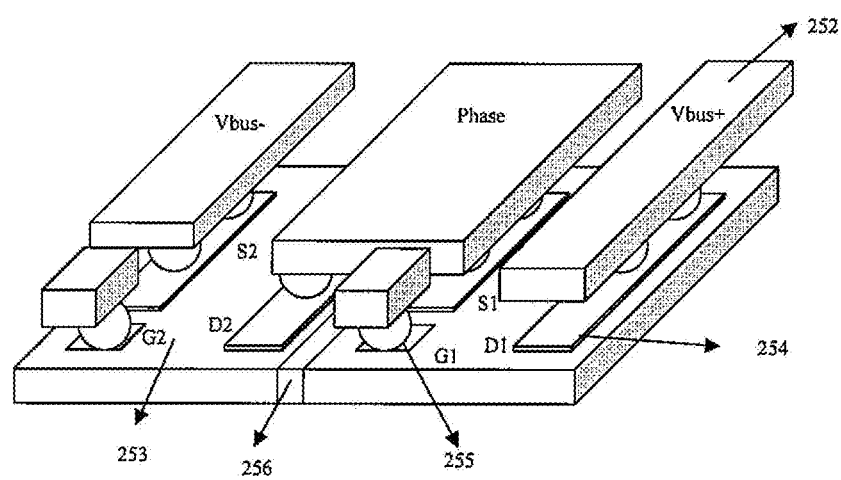
FIG. 27 is a schematic view of a structure of a chip package module in half bridge configuration using the flip-chip process having a conductive ball according to the fifth embodiment of the present disclosure.
Figure 28:
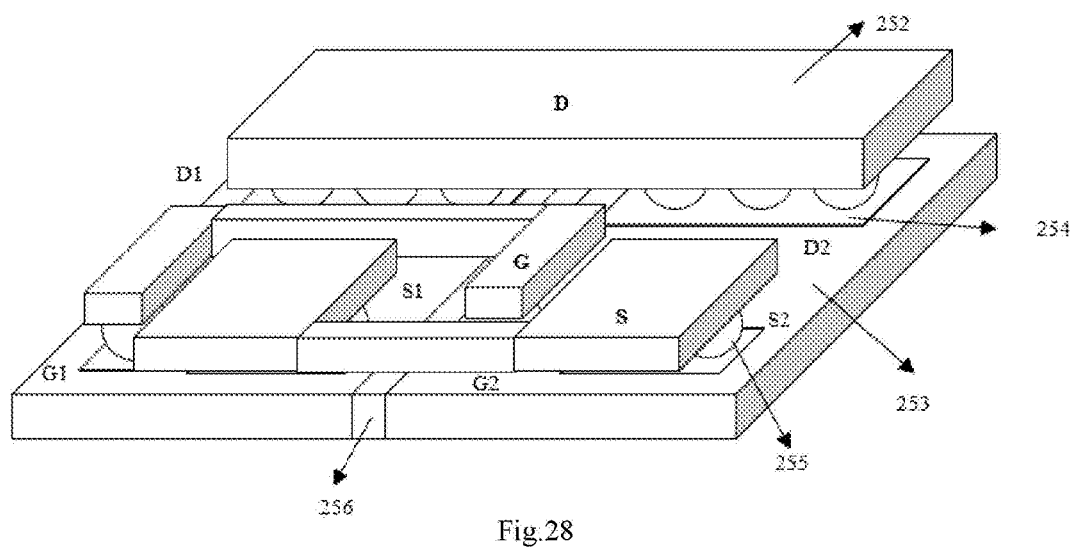
FIG. 28 is a schematic view of a structure of a chip package module in parallel configuration using the flip-chip process having a conductive ball according to the fifth embodiment of the present disclosure.

FIGS. 27 and 28 respectively show that the surface of the chip is bonded to the conductive trace of the substrate via the conductive ball, and an electrical connection is realized between the half bridge module and the parallel-connected chip module. In FIGS. 27 and 28, the reference number 255 refers to the conductive ball, the material of which may be a solder, Cu, Au, Ag or other alloy. Generally, the conductive ball needs to adopt the conductive die-attach material as mentioned above so as to realize the mechanical and electrical connection between the conductive trace of substrate and the surface of the chip via the conductive ball.

Figure 29:
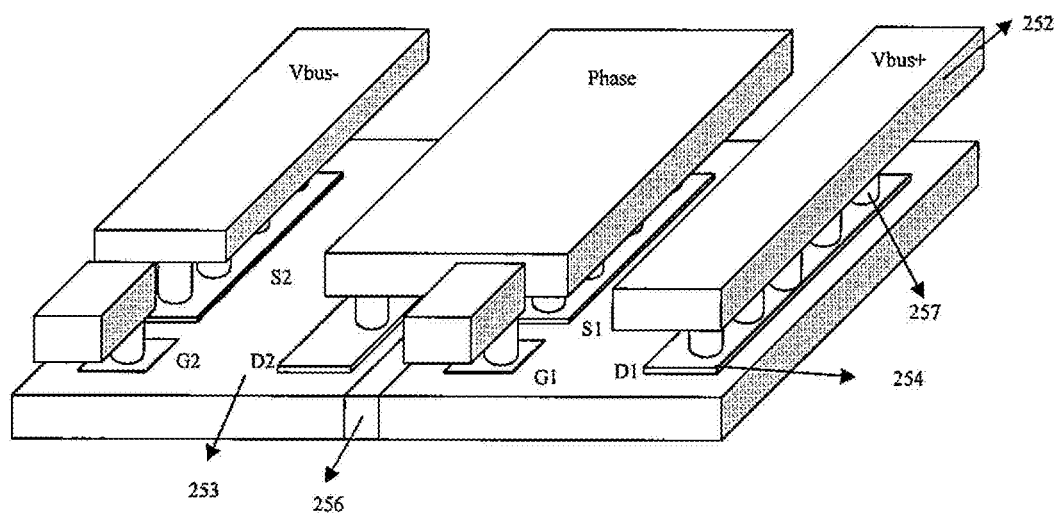
FIG. 29 is a schematic view of a structure of a chip package module in half bridge configuration using the flip-chip process having a conductive pillar according to the fifth embodiment of the present disclosure.
Figure 30:
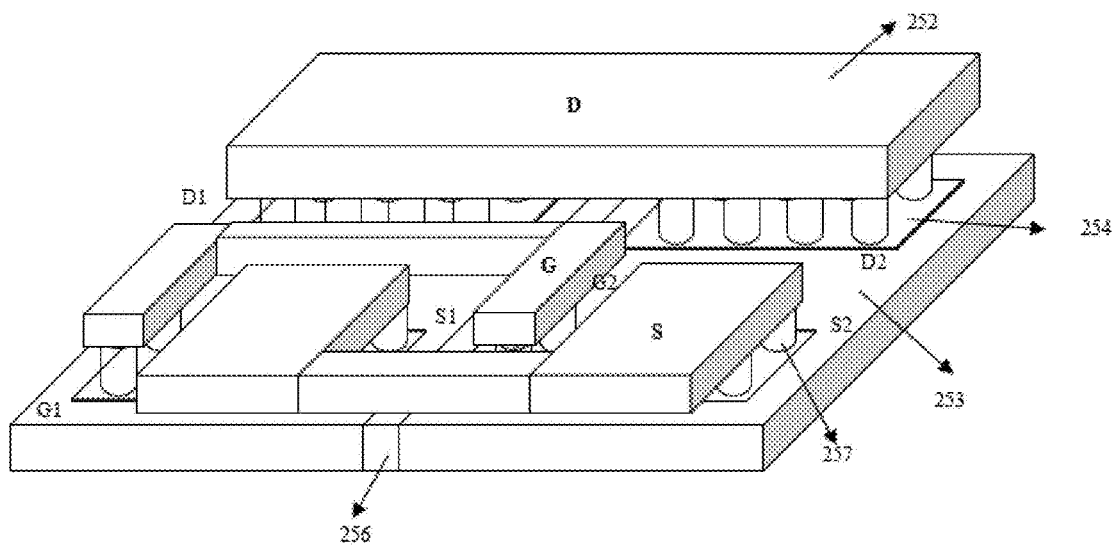
FIG. 30 is a schematic view of a structure of a chip package module in parallel configuration using the flip-chip process having a conductive pillar according to the fifth embodiment of the present disclosure.
Figure 31:
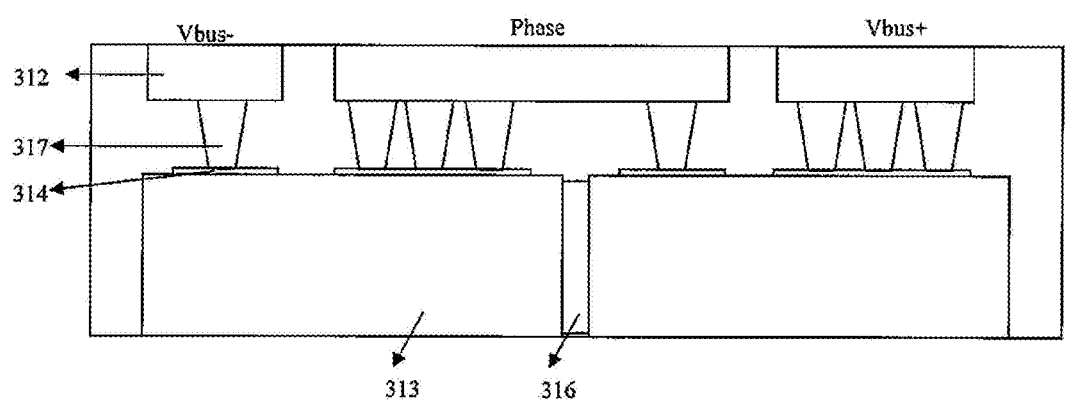
FIG. 31 is a schematic sectional view of a main loop of the package module in half bridge structure according to the fifth embodiment of the present disclosure as shown in FIG. 29.

FIGS. 29 and 30 respectively show that the surface of the chip is bonded to the conductive trace of substrate via a conductive pillar, and an electrical connection is realized between the half bridge module and the parallel-connected chip module. The conductive pillar may be a solder, Cu, Au, Ag or other alloy. Generally, the conductive pillar also needs to adopt the conductive die-attach material as mentioned above so as to connect different electrodes of the chip to the conductive trace of substrate. The conductive pillar may be formed at S, D and G terminals on top surfaces of the chips by electroplating process. The conductive pillar is indicated by a reference number 277 in FIGS. 29 and 30, and realizes a connection between the conductive pillar and the metal layer on the surface of the chips. The conductive trace may also be formed by electroplating a metal, and then a pattern of the conductive traced is formed by the etching technology. FIG. 31 is a cross section view of a main loop of the package module in half bridge configuration as shown in FIG. 29, the conductive pillar is generally in a cylindrical shape or an inverted tapered shape. In FIG. 31, a conductive trace 312, chips 313, a die-attach material 314, a bonding part 316 between chips and a conductive pillar 317 with inverted tapered shape are included. The conductive pillar 317 and the conductive trace 312 may be the same or different conductive material.

The present embodiment adopts the flip-chip process in combination with the conductive ball or the conductive pillar, such that parasitic parameter in the loop could be further reduced.

Sixth Embodiment

Figure 32:
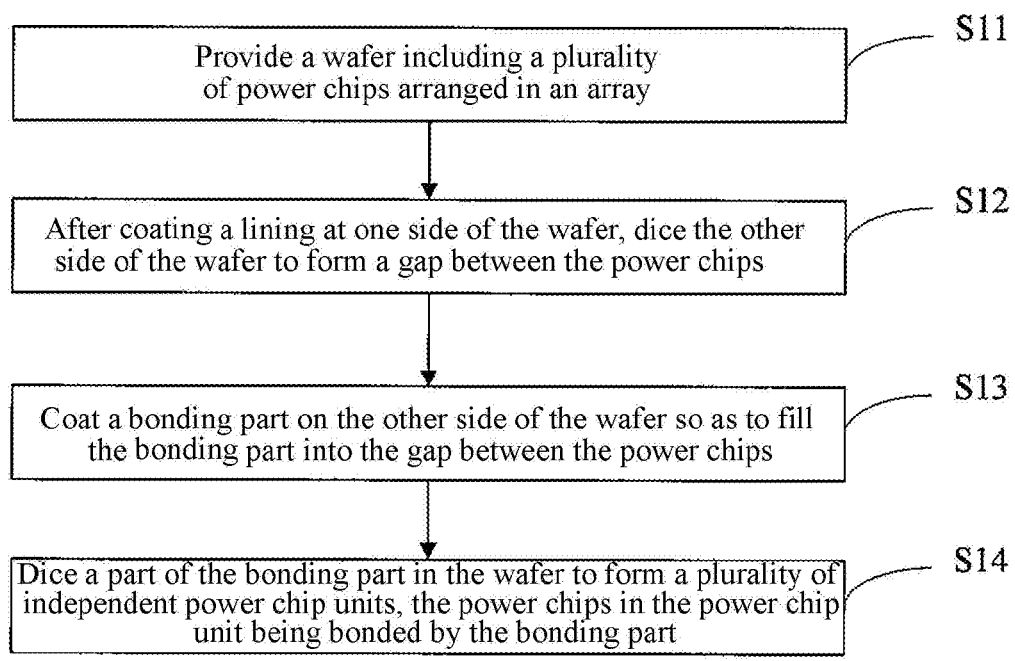
FIG. 32 is a flow chart of a method for manufacturing a power chip unit according to the sixth embodiment of the present disclosure.

The present embodiment further provides a method of manufacturing a power chip unit, wherein, the power chip unit includes at least two power chips placed in parallel. As shown in FIG. 32, the manufacturing method includes the steps as follows.

In step S11, a wafer including a plurality of power chips arranged in an array is provided.

In step S12, after coating a lining at one side of the wafer, the other side of the wafer is diced to form a gap between the power chips.

In step S13, a bonding part is coated on the other side of the wafer to fill the bonding part into the gap between the power chips.

In step S14, a part of the bonding part in the wafer is diced to form a plurality of independent power chip units, the power chips in the power chip unit being bonded by the bonding part.

The gap between the two power chips is smaller than a preset width. In the present embodiment, the preset width preferably is smaller than or equal to 200 μm. Meanwhile, there are certain requirements for the material and performance of the bonding part in the gap of chips, particularly, the material of the bonding part has a rigidity more than Shore A10, an insulating strength more than 10 kV/mm, and an electrical resistivity more than 1.0E11 Ω·cm. Moreover, the material of the bonding part is an insulated material, but has ingredient and characteristic different from that of the sealing layer in the conventional package power chip unit. The material of the sealing layer is generally a silicone gel, a silicone elastomer, an epoxy molding material, and the like, while the bonding part may be made of bonding material of organic silicone resin including: pure resin-based organic silicone adhesive, epoxy modified silicone adhesive, phenolic modified silicone adhesive and the like; also may be one-component or two-component vulcanized silicone elastomer; or may be an epoxy resin which may be filled with filler to adjust its physical characteristics. If filler is filled in the bonding part, the maximum diameter of the filler should be smaller than the preset width.

Figure 33:
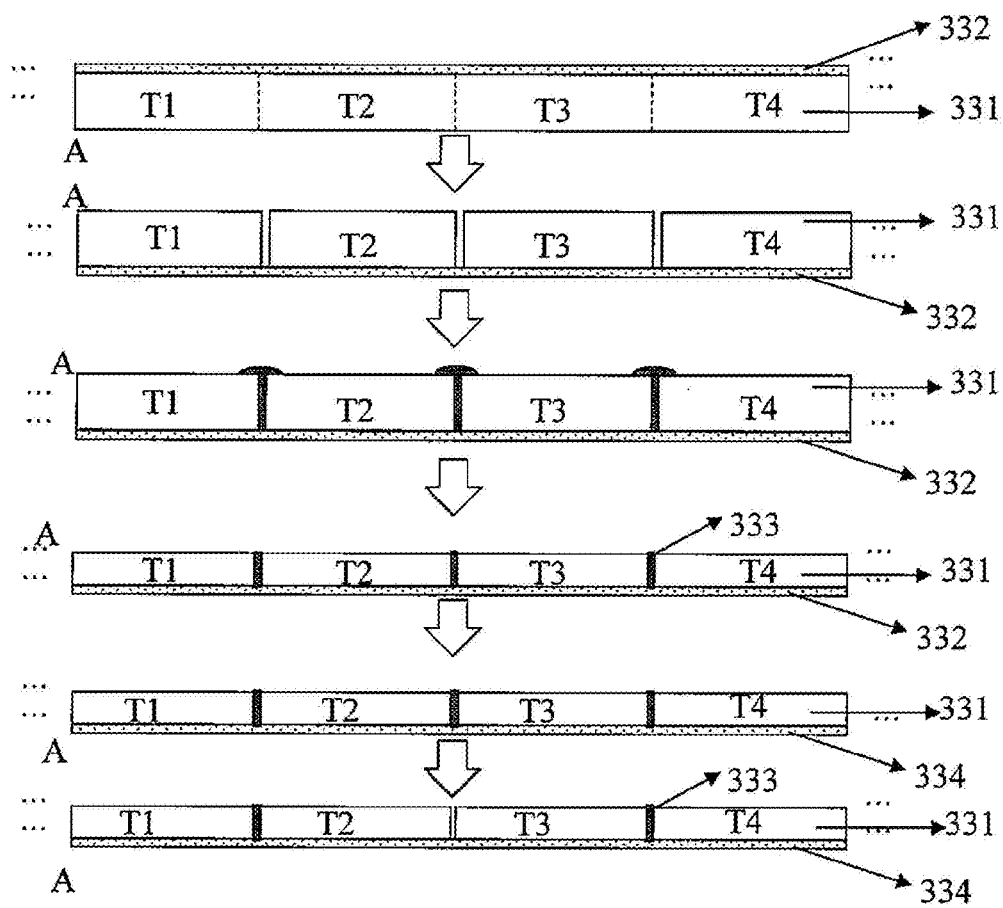
FIG. 33 is a flow chart of a back-end process for wafer according to the sixth embodiment of the present disclosure.
Figure 34:
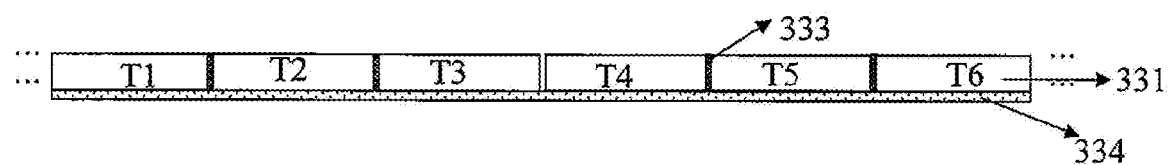
FIG. 34 is a schematic view of the power chip unit having three power chips diced by the procedure as shown in FIG. 33.

Prior to the above steps, performing a front-end process for a wafer is further included, i.e., after metalizing the circuit at top surface of the chip, performing a back-end process for the wafer according to the present embodiment so as to realize insulation between the chips and bond the chips with close distance. Based on the above, FIG. 33 is a flow chart of the back-end process for wafer, including: Step 1, attaching the metalized surface of the wafer 331 to a blue film or a UV film 332; Step 2, turning a back side (represented by A in the drawing) of the wafer 331 to be upward, i.e., the base directs upward, dicing the wafer 331 along a dicing slot from the back side of the wafer (i.e. the base) by a dicing knife so as to make every planar chip on the wafer independent. Taking an example of four power chips on the wafer as shown in the drawing, the four power chips T1,T2,T3,T4 are separated from each other; Step 3, filling flowing bonding part 333 (insulated material with cohesiveness) into the dicing slot in manner of dispensing, spin-coating or the like, and performing curing process after the bonding part flowing through and being filled into the dicing slot; Step 4, thinning the base of the wafer to a required thickness; Step 5, removing the top surface, i.e., the metalized blue film, and bonding the base (i.e., the side A) of the wafer onto the blue film 334; if the base of the planar chip is connected by chip connection process such as welding or sintering, the surface metalized treatment may be applied to the base of the wafer; and Step 6, dicing in accordance with package requirement, if requiring two chips to be packaged simultaneously, dicing the wafer every two chips. The above back-end process for wafer is not limited to manufacture two bonded power chips, but also adaptable for more than two bonded power chips, such as the power chip unit including three power chips, which could be diced as shown in FIG. 34.

In the manufacturing method according to the present embodiment, during the wafer handling, the bonding part is filled in the gap between two parallel-placed power chips, which could reduce the distance between chips compared with the conventional chips bonded one by one, and the chips are insulated and bonded with the help of the bonding part so as to obtain a bonding between chips with close distance. During packaging the semiconductor power module, a plurality of power chips could be packaged by one mounting process, such that the mounting efficiency could be improved. Moreover, the distance between chips is reduced, therefore, the parasitic inductance between the parallel-arranged power chips connected in series is reduced, the maximum junction temperature of chips is decreased, such that loss and voltage stress of the power chip is decreased, thusly improving reliability and efficiency of the chips.

It should be understood by those skilled in the art, various modifications and variation made without departing from the spirit and the scope of the present disclosure belong to the protection scope of the claims of the present disclosure.

What is claimed is:

1. A method of manufacturing a power chip unit, the power chip unit comprising at least two power chips placed in parallel, and the method comprising the following steps performed in sequence:
- providing a wafer comprising a plurality of power chips arranged in an array;
- attaching a metalized side of the wafer to a film;
- turning over the wafer so that an un-metalized side that is opposite to the metalized side of the wafer to be upward;
- dicing the un-metalized side of the wafer to form a gap between the power chips so that a distance between the power chips is a width of a dicing blade for dicing the wafer, wherein the width is no more than 200 µm;
- coating a bonding part on the un-metalized side of the wafer to fill the bonding part into the gap between the power chips;
- thinning the un-metalized side of the wafer to a required thickness;
- removing the film from the metalized side and bonding the un-metalized side of the wafer onto another film; and
- dicing a part of the bonding part in the wafer to form a plurality of independent power chip units, wherein the power chips in the power chip unit are bonded by the bonding part.

2. The method according to claim 1, wherein a gap between the power chips is smaller than a preset width.

3. The method according to claim 2, wherein the preset width is smaller than or equal to 200 µm.

4. The method according to claim 1, wherein a material of the bonding part has a rigidity more than Shore A10, an insulating strength more than 10 kV/mm, and an electrical resistivity more than $1.0E11$ Ω·cm.

* * * * *